PULSE STRETCHER-DISCRIMINATOR WHOSE COMPONENT ELECTRONICS EXHIBIT CONSTANT POWER DISSIPATION

Filed July 1, 1966 2 Sheets-Sheet 1

INVENTOR
G. L. MILLER
BY Lucian C. Canepa
ATTORNEY

Nov. 18, 1969 G. L. MILLER 3,479,534

PULSE STRETCHER-DISCRIMINATOR WHOSE COMPONENT ELECTRONICS
EXHIBIT CONSTANT POWER DISSIPATION

Filed July 1, 1966 2 Sheets-Sheet 2

United States Patent Office 3,479,534
Patented Nov. 18, 1969

3,479,534

PULSE STRETCHER-DISCRIMINATOR WHOSE COMPONENT ELECTRONICS EXHIBIT CONSTANT POWER DISSIPATION

Gabriel L. Miller, Westfield, N.J., assignor to Bell Telephone Laboratories, Incorporated, Murray Hill and Berkeley Heights, N.J., a corporation of New York Filed July 1, 1966, Ser. No. 562,376
Int. Cl. H03k 5/04
U.S. Cl. 307—267 4 Claims

ABSTRACT OF THE DISCLOSURE

A circuit configuration is disclosed for providing constant power dissipation of component transistors in a pulse stretcher-discriminator. The circuit configuration provides for maintaining the first transistor of a common-emitter configuration transistor input pair in the ON condition following the application of an input pulse and during the so-called rundown time of the stretcher-discriminator. (The second transistor of the input pair remains on as a matter of course.) An auxiliary transistor and diode are arranged to form a closed loop around the input pair during the rundown period thereby to prevent the first transistor from shutting off.

Figure 1:
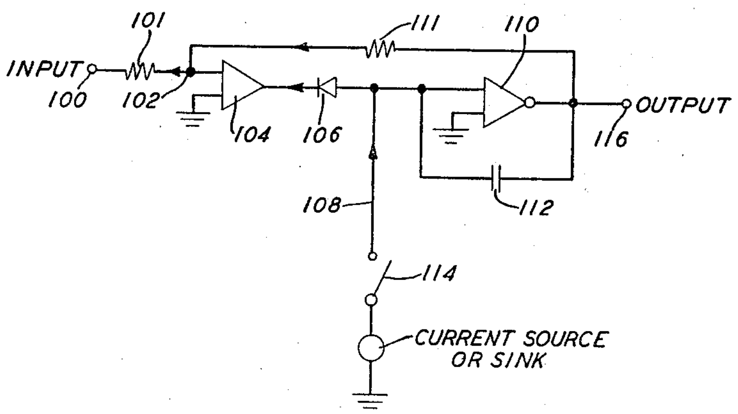
FIG. 1 PRIOR ART

This invention relates to pulse stretchers and discriminators and more particularly to a combined stretcher-discriminator in which certain critical components exhibit nearly constant power dissipation.

Stretchers and discriminators find considerable application in analog-to-digital converters such as are used in pulse-height analyzers and hybrid analog-digital computers. The trend toward increased speed and accuracy in both pulse-height analysis and analog-digital computation has emphasized the need for an improvement in the component electronics. For example, certain semiconductor radiation detectors exhibit resolutions and stabilities of better than 0.1%, while the associated electronic systems may drift by 1% per day. Obviously, the value of improving the resolution capability of such detectors is lost unless associated electronic systems which exhibit stabilities comparable to those of the detectors can be developed.

One of the primary problems associated with the electronics of stretchers and discriminators used in the above-mentioned systems (as with many electronic circuits) is that of thermal drift. For transistor electronics, the thermal drift results from the variation of transistor parameters (notably $h_{FE}$, $I_{CO}$ and $V_{BE}$) with temperature. Temperature changes in a transistor are, in turn, caused by ambient temperature change or by varying power dissipation in the transistor.

Accordingly, it is an object of this invention to provide a stretcher-discrimination whose critical component electronics exhibit substantially constant power dissipation and, consequently, improved stability.

It is another object of this invention that temperature equilibrium between certain transistors of the stretcher-discriminator be achieved in an extremely short period of time.

These and other objects of the present invention are realized in a stretcher-discriminator configuration comprising a noninverting current amplifier connected through a diode to an operational integrator comprising an inverting amplifier in parallel with a capacitor. The output of the integrator is connected through a resistor to the input of the noninverting amplifier. Negative-going input pulses are applied to the input of the noninverting amplifier, causing the capacitor to charge to amplitudes proportional to the amplitudes of the incoming pulses. "Rundown" current is then applied to the input of the integrator, linearly discharging the capacitor. The discharge times are proportional to the amplitudes of the input pulses.

The noninverting amplifier comprises a unique circuit configuration for maintaining nearly constant power dissipation in critical component transistors. The basic amplifier circuit is composed of a differential common-emitter transistor pair connected to a third transistor. A fourth transistor connects the emitter of the third transistor to the base of the first transistor, completing a loop around the input pair which serves to maintain the first transistor in the ON condition during the bulk of the rundown period. The second transistor remains on as a matter of course. With the transistor input pair remaining on during the converting process, nearly constant power dissipation in the two transistors is achieved. This, in turn, serves to keep the two transistors at approximately the same temperature, thus maintaining equality of the critical transistor parameters: base-emitter voltage ($V_{BE}$), collector-base leakage current ($I_{CBO}$), and DC current gain ($h_{FE}$).

Other methods of maintaining temperature equality between transistors, such as mounting the transistors in close proximity on a common heat sink, are not satisfactory if high conversion speeds are desired. This is because heat conduction between the transistors is not fast enough to maintain the desired temperature equalibrium.

It is a feature of this invention that feedback circuitry connecting the output of the noninverting amplifier of the stretcher-discriminator to the input thereof be provided for maintaining nearly constant power dissipation in critical transistors of the noninverting amplifier.

It is another feature of this invention that the noted feedback circuitry comprise a control diode and a transistor for selectively controlling the conduction condition of one transistor of the amplifier, thereby achieving temperature equilibrium between the above-mentioned critical transistors in extremely short intervals of time.

Figure 2:
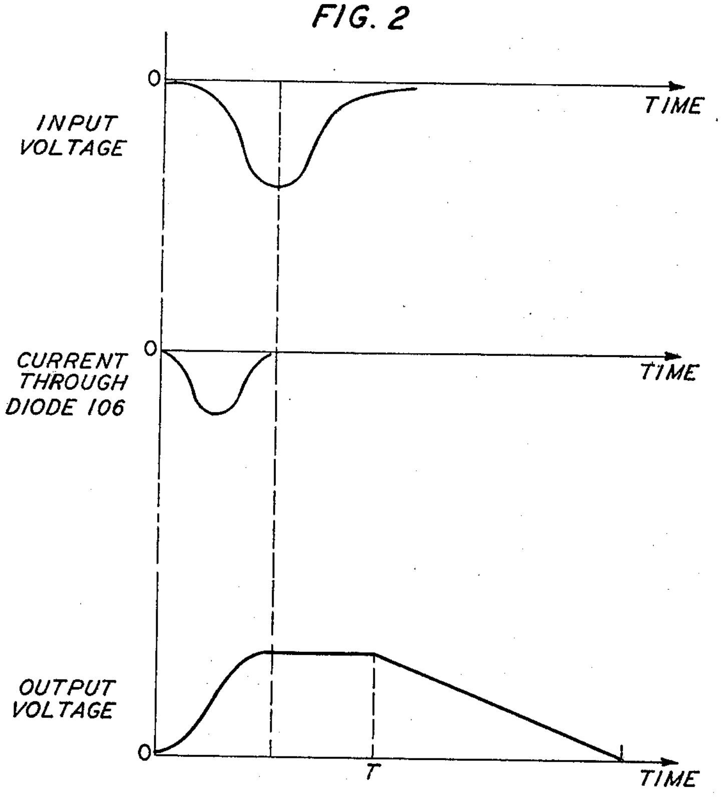
Figure 3:
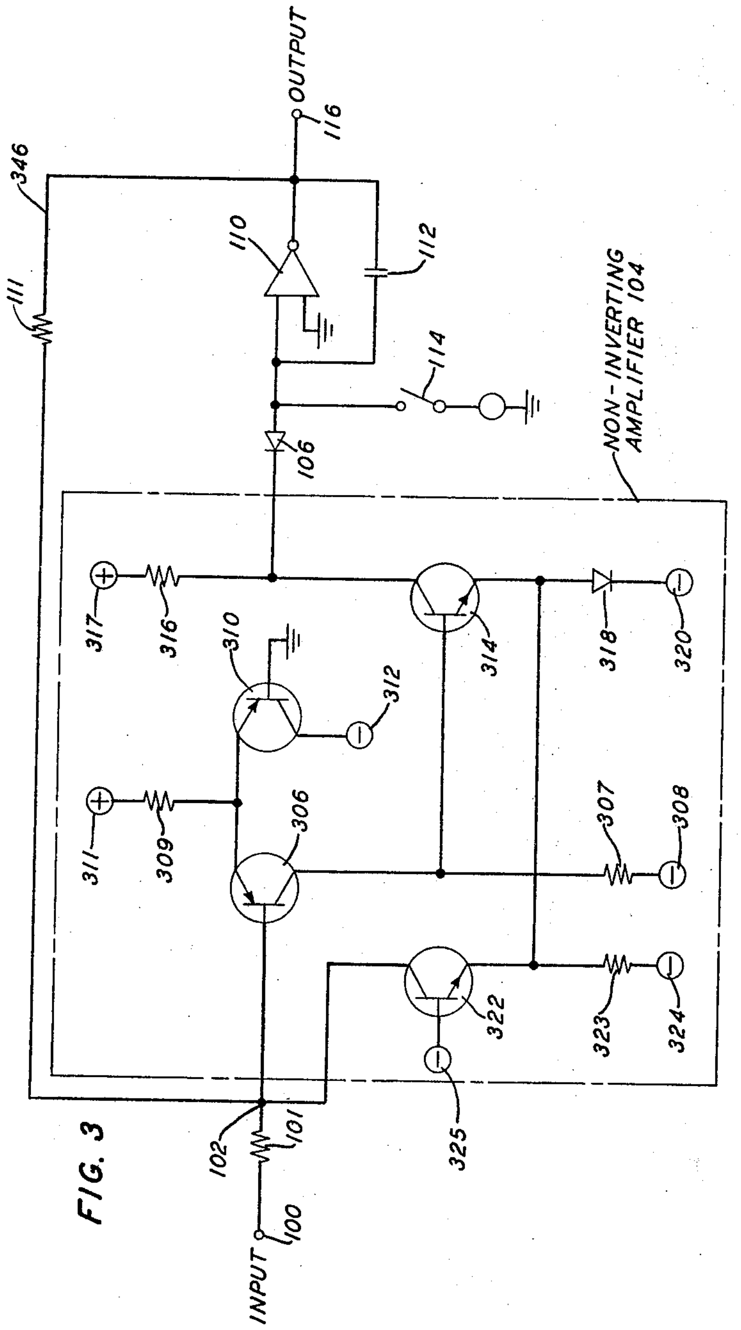

A complete understanding of the present invention and of the above and other features and advantages thereof will become apparent from a consideration of the following detailed description of an illustrative embodiment thereof presented hereinbelow in conjunction with the drawings, in which:

FIG. 1 shows a block diagram of a conventional stretcher-discriminator;

FIG. 2 shows the waveforms of the input and output voltages of the stretcher-discriminator of FIG. 1 and the current through a diode included therein; and FIG. 3 is a detailed showing of a specific illustrative circuit configuration, made in accordance with the principles of the present invention, for achieving constant power dissipation in the electronics of the noninverting amplifier of the stretcher-discriminator shown in FIG. 1.

A brief description of the overall operation of the stretcher-discriminator shown in FIG. 1 will be given as background before discussing the details of the illustrative embodiment of the invention. The block configuration of the stretcher-discriminator is essentially identical to that suggested by Arbel in Nuclear Electronics II, International Atomic Energy Agency, 1962. A negative voltage pulse to be "stretched" or "converted" (shown in the top-most diagram of FIG. 2) is applied to an input terminal 100, causing a negative current flow through a resistor 101, through a virtual ground node 102 to a current amplifier 104 and through a resistor 111. (All arrows shown on the various leads and connections of the stretcher-discriminator indicate the direction of *positive* current flow). The negative current is amplified by the amplifier 104 and passed through a diode 106 to an operational integrator comprising an inverting voltage amplifier 110 and a capacitor 112. During the application of the input pulse, a switch 114 is open such that no current flows through the lead 108. The capacitor 112 is thus charged to an amount proportional to the amplitude of the input pulse. As shown in the second diagram of FIG. 2, the current through the diode ceases after the input pulse passes its peak. This is a result of feedback action through the resistor 111 (refer to Arbel previously cited). The feedback path also serves to keep the voltage at the virtual ground node 102 at ground level, given that the inverting amplifier gain is very high. This is a well-known function of operational amplifier configurations.

Discharge of the capacitor 112 (linear rundown) commences when the switch 114 (FIG. 1) is closed. The closing of the switch 114 is represented as occurring at time T in the third diagram of FIG. 2. As also shown in this diagram, the voltage at an output node 116 decreases linearly during discharge. The rundown time is proportional to the amplitude of the input pulse. Thus, the input voltage may be considered as having been converted to a time interval which may then be converted to a digital representation with the employment of appropriate circuitry to detect the beginning and end of rundown in combination with a suitable counter for counting during rundown.

The noninverting amplifier 104 modified to embody the principles of the present invention is shown in detail in FIG. 3. (Identical components in FIGS. 1 and 3 are designated by the same reference numerals.) This modification includes first and second PNP-type transistors 306 and 310 connected in the differential common-emitter configuration, the common-emitter circuit being connected through a resistor 309 to a *positive* voltage source 311. The base of the second transistor 310 is connected to ground, and the collector thereof is connected to a negative voltage source 312. The base of the first transistor 306 is connected to the virtual ground node 102 and through the resistor 101 to the input node 100. The collector of the first transistor 306 is connected to the base of an NPN-type third transistor 314 and through a resistor 307 to a negative voltage source 308. The collector of the third transistor 314 is connected through a resistor 316 to a *positive* voltage source 317 and also through the diode 106 to the operational integrator 110 identified earlier. As already described, the output of the operational integrator is connected through the resistor 111 to the virtual ground node 102. The emitter of the third transistor 314 is connected through a diode 318 to a negative voltage source 320 and also to the emitter of a fourth transistor 322, of type NPN, and through a resistor 323 to a negative voltage source 308. The base of the fourth transistor 322 is connected to a negative voltage source 325, while the collector thereof is connected to the virtual ground node 102.

The detailed operation of the above-described circuit is as follows. Quiescently, the transistors 306 and 310 are in the ON condition, sharing their common-emitter current. Upon application of a negative input pulse at the input node 100, and until the peak of the pulse is reached, the potential at the base of the transistor 306 is lowered (below ground potential) causing the transistor to conduct more than its usual current. This, in turn, increases the base potential of the transistor 314, causing it to conduct more current and to forward bias the diode 106. As a result, a negative charge is deposited on the left-hand plate of the capacitor 112, the input potential of the inverting amplifier 110 is lowered, and the potential at the output node 116 is increased. The increase in potential at the output 116 is proportional to the amplitude of the input pulse. It should be noted that the increase in current conduction by the transistor 306 upon the application of an input pulse (as described above) changes the power dissipation of the transistor pair only slightly. In actual practice this change is not sufficient to cause thermal instability in the transistor pair.

When the peak of the input pulse is reached, and as a result of feedback action in the loop 346, the virtual ground node 102 returns to ground potential. Thus, the transistors 306 and 314 return to the same operating condition as before the application of the input pulse, resulting in the reverse biasing of the diode 106 and the cutting off of current flow through the diode 106. Upon passage of the peak of the input pulse, the base voltage of the transistor 306 begins to increase, tending to shut the transistor off. If the transistor 306 were allowed to turn off and remain turned off during the rundown time of the stretcher-discriminator, the transistor 310 would conduct all the common-emitter current, thus dissipating more than its quiescent power. The temperature of the transistor 306 would thus decrease while that of the transistor 310 would increase. As mentioned earlier, it is well known that various transistor parameters are seriously affected by temperature changes and that unless some means of compensation is provided for these changes, circuit instability and drift will result. That is, circuit response will vary depending on the value of the various transistor parameters when the input pulses are applied. For example, the circuit response to a particular input pulse which was preceded by a low-amplitude input pulse would be different from the response to the same pulse preceded by a high-amplitude input pulse. This, of course, is because the temperature and thus the transistor parameters would assume different values following the application of the large and small input pulse. Thus, circuit response would not be stable, but rather, would vary depending on what input pulses had preceded the pulse in question.

One means of compensating for temperature changes in a transistor is to associate a second transistor therewith arranged in the differential common-emitter configuration such as that shown in FIG. 3 (transistors 306 and 310). However, for the particular stretcher-discriminator application of FIG. 3, the differential arrangement alone is not sufficient. This is evidenced by the transistor 306 tending to shut off and thus decrease in temperature after the peak of the input pulse passes while the transistor 310 tends to increase in temperature.

In order to maintain constant power dissipation in the transistors 306 and 310 and thus maintain nearly constant temperature, it is necessary to keep the transistor 306 ON during the rundown time. In accordance with the principles of the present invention this is accomplished with the inclusion of the diode 318 and the transistor 322 as follows. The passage of the peak of the input pulse increases the base voltage of the transistor 306, thereby causing the collector voltage of the transistor 306 to fall. As a result, the base voltage of the transistor 314 falls. In turn, the emitter voltage of the transisor 314 falls, reverse biasing the diode 318 and causing it to open. Consequently the emitter voltage of the transistor 322 falls, causing the transistor 322 to turn ON and to conduct current from the virtual ground node 102. This lowers the base voltage of the transistor 306, thus compensating for the increase in voltage due to the trailing edge of the input pulse. The transistor 306 thus remains ON during rundown, and nearly constant power dissipation in the differential transistor pair 306 and 310 is maintained. The end of rundown occurs when the virtual ground node 102 and the output node 116 return to ground potential.

It is to be understood that the above-described arrangement is only illustrative of the application of the principles of the present invention. Other arrangements may be described by those skilled in the art without departing from the spirit and scope of the invention.

What is claimed is:

1. In combination,
a differential pair comprising first and second transistors arranged in the differential common-emitter configuration,
a feedback circuit comprising a third transistor, a diode, an operational integrator, means connecting the output of said differential pair in series with said third transistor and said diode to the input of saia operational integrator, and a feedback path connecting the output of said operational integrator to the input of said differential pair, said feedback circuit in conjunction with a specified input condition tending to shut said first transistor off while said second transistor remains on,
a control diode connected to said third transistor, and
a fourth transistor connecting said third transistor to the input of said differential pair for maintaining said first transistor in the ON condition while said specified input condition is present.

2. A combination as in claim 1 wherein the base of said third transistor is connected to the collector of said first transistor, the collector of said third transistor is connected through said first diode to the input of said operational integrator which comprises an inverting amplifier connected in parallel with a capacitor, the output of said integrator is connected by said feedback path comprising a resistor to the base of said first transistor, the emitter of said third transistor is connected through said second diode to a negative voltage source and to the emitter of said fourth transistor, and the collector of said fourth transistor is connected to the base of said first transistor for maintaining said transistor in the ON condition.

3. In combination, a transistor pair arranged in the differential common-emitter configuration, feedback means connecting the output of said pair to the input thereof which functions in conjunction with a specified input condition to cause one of the transistors of said pair to tend to shut off while the other transisor remains on, a third transistor connecting the input of said pair to said feedback means, and a control diode connected to said third transistor and to said feedback means, the combination of said third transistor and said control diode providing a current path for maintaining said transistor which tends to shut off in the ON condition while said specified input condition is present.

4. A pulse stretcher-discriminator comprising a noninverting amplifier connected through a diode to an operational integrator, feedback means connecting the output of said integrator to the input of said amplifier, said amplifier comprising first and second transistors arranged in the differential common-emitter configuration, and transistor-diode means interconnecting said first and second transistors for maintaining nearly constant power dissipation in said first and second transistors to achieve low output drift of said amplifier.

UNITED STATES PATENTS

References Cited

| | | | |
|---|---|---|---|
| 3,073,971 | 1/1963 | Daigle | 328—146 XR |
| 3,144,564 | 8/1964 | Sikorra | 307—88.5 |
| 3,168,709 | 2/1965 | Sikorra | 330—30 |
| 3,292,098 | 12/1966 | Bensing | 307—235 XR |
| 3,370,245 | 2/1968 | Royce et al. | 330—30 |

JOHN S. HEYMAN, Primary Examiner

S. D. MILLER, Assistant Examiner

U.S. Cl. X.R.

307—229, 235; 330—30, 297, 310